US012580369B2

(12) United States Patent
    Uki

(10) Patent No.: US 12,580,369 B2
(45) Date of Patent: Mar. 17, 2026

(54) ELECTRIC JUNCTION BOX

(71) Applicant: YAZAKI CORPORATION, Tokyo (JP)

(72) Inventor: Kazutaka Uki, Kakegawa (JP)

(73) Assignee: YAZAKI CORPORATION, Tokyo (JP)

( * ) Notice: Subject to any disclaimer, the term of this patent is extended or adjusted under 35 U.S.C. 154(b) by 14 days.

(21) Appl. No.: 18/799,589

(22) Filed: Aug. 9, 2024

(65) Prior Publication Data

US 2025/0079813 A1      Mar. 6, 2025

(30) Foreign Application Priority Data

Sep. 6, 2023     (JP) ................................. 2023-144570

(51) Int. Cl.
| | |
|---|---|
| *B60R 16/023* | (2006.01) |
| *H02G 3/03* | (2006.01) |
| *H02G 3/08* | (2006.01) |
| *H02G 3/16* | (2006.01) |
| *H05K 7/20* | (2006.01) |

(52) U.S. Cl.
CPC ........... *H02G 3/03* (2013.01); *B60R 16/0239* (2013.01); *H02G 3/081* (2013.01); *H02G 3/16* (2013.01); *H05K 7/2039* (2013.01)

(58) Field of Classification Search
CPC .......................... B60R 16/0239; H05K 7/2039
See application file for complete search history.

(56) References Cited

U.S. PATENT DOCUMENTS

| | | | | |
|---|---|---|---|---|
| 10,263,405 | B2 * | 4/2019 | Chin ................... | B60R 16/0238 |
| 2018/0083375 | A1 * | 3/2018 | Matsumura ......... | B60R 16/0238 |
| 2019/0214805 | A1 | 7/2019 | Hiramitsu et al. | |
| 2021/0101545 | A1 * | 4/2021 | Kurata ............... | B60R 16/0239 |
| 2022/0085587 | A1 | 3/2022 | Munezuka et al. | |
| 2024/0088636 | A1 * | 3/2024 | Yoshimura ............. | H02G 3/081 |
| 2024/0186777 | A1 * | 6/2024 | Katsuse ................... | H05K 5/02 |

FOREIGN PATENT DOCUMENTS

| | | |
|---|---|---|
| JP | H03-103605 A | 4/1991 |
| JP | 2004-186504 A | 7/2004 |
| JP | 2018-74618 A | 5/2018 |
| JP | 2022-047797 A | 3/2022 |
| WO | 2018/043073 A1 | 3/2018 |

* cited by examiner

*Primary Examiner* — Hung V Ngo
(74) *Attorney, Agent, or Firm* — KENEALY VAIDYA LLP

(57) ABSTRACT

An electric junction box includes: a cooling member; and a pair of conductive members disposed to sandwich the cooling member. Each of the pair of conductive members includes a housing portion, an electronic component disposed inside the housing portion, and a busbar that is provided on a mounting wall as one box wall of the housing portion and is electrically connected to the electronic component, and each of the pair of conductive members is disposed such that an outer surface of the mounting wall faces the outer surface of the cooling member. The electronic component includes a plurality of terminals, and a movable contact point that is provided inside the electronic component, and the electronic component is configured in such a manner that the movable contact point is located at a position farther away from the side wall than the plurality of terminals in the electronic component.

3 Claims, 4 Drawing Sheets

REAR

LEFT ◄─────► RIGHT

FRONT

ELECTRIC JUNCTION BOX

CROSS-REFERENCE TO RELATED APPLICATION(S)

This application is based upon and claims the benefit of priority from prior Japanese patent application No. 2023-144570 filed on Sep. 6, 2023, the entire contents of which are incorporated herein by reference.

BACKGROUND

1. Field of the Invention

The present disclosure relates to an electric junction box that includes a cooling member capable of absorbing heat from outer surfaces and dissipating heat to the outside, and a pair of conductive members disposed to sandwich the cooling member.

2. Description of the Related Art

An electric junction box to be mounted on a vehicle or the like has been proposed in the related art. For example, an electric junction box in the related art has a box shape as a whole, and includes a busbar connected to an external power supply or the like, an electronic component connected to the busbar such as a relay or a fuse, and a case accommodating the busbar and the electronic component (for example, see JP2022-047797A).

However, in the above-described type of electric junction box, in general, when the electronic component (particularly, the relay or the fuse) is operated, Joule heat associated with energization is generated in an internal circuit of the electronic component, the busbar, and the like. From the viewpoint of appropriately operating the electronic component over a long period of time, it is desirable to efficiently dissipate such heat generated at various locations during energization to the outside.

SUMMARY

An object of the present disclosure is to provide an electric junction box having excellent heat dissipation.

In order to achieve the object described above, an electric junction box according to the present disclosure is characterized as follows.

According to an aspect of the present disclosure, there is provided an electric junction box including: a cooling member capable of absorbing heat from outer surfaces and dissipating heat to the outside; and a pair of conductive members disposed to sandwich the cooling member, in which each of the pair of conductive members includes a housing portion having a box shape, an electronic component disposed inside the housing portion, and a busbar that is provided on a mounting wall as one box wall of the housing portion and is electrically connected to the electronic component, and each of the pair of conductive members is disposed such that an outer surface of the mounting wall faces the outer surface of the cooling member, and the electronic component includes a plurality of terminals that are provided on a side wall of the electronic component and are connected to the busbar, and a movable contact point that is provided inside the electronic component and is capable of mechanically switching a conductive state and a non-conductive state between predetermined terminals among the plurality of terminals, and the electronic component is configured in such a manner that the movable contact point is located at a position farther away from the side wall than the plurality of terminals in the electronic component.

According to the electric junction box of the present disclosure, the pair of conductive members each incorporating the electronic component and the busbar are disposed such that the outer surfaces of the mounting walls of these conductive members face the outer surfaces of the cooling member and sandwich the cooling member. Accordingly, Joule heat, which is generated in an internal circuit of the electronic component, a contact point between the electronic component and the busbar, and the busbar during energization, is easily absorbed by the cooling member through the mounting walls. Further, since the pair of conductive members are disposed to sandwich the cooling member, a heat absorption capability of the cooling member can be used without waste as compared with a case in which only one outer surface of the cooling member is used for heat absorption, and thus the electric junction box having the present configuration has excellent heat dissipation.

Further, the size of the cooling member can be reduced as compared with a case in which the pair of conductive members are simply disposed side by side on one outer surface of the cooling member, and thus it is possible to achieve miniaturization and cost reduction of the electric junction box. In addition, when the electric junction box is used in a posture in which the outer surfaces of the cooling member and the mounting walls of the conductive members extend in a vertical direction (an upper-lower direction), the terminals and the movable contact point are disposed to be aligned in a direction (for example, a lateral direction) intersecting the vertical direction in the electronic component connected to the busbar. Therefore, for example, even in a case in which a component around the movable contact point falls off due to aged deterioration, an excessive external force, or the like, the component falls downward in the vertical direction, and thus it is possible to avoid the component from interfering with the switching of the conductive state and the non-conductive state between the movable contact point and the terminals.

The present disclosure has been briefly described above. Further, the details of the present disclosure can be clarified by reading modes (hereinafter, referred to as "embodiments") for carrying out the disclosure described below with reference to the accompanying drawings.

BRIEF DESCRIPTION OF THE DRAWINGS

The present disclosure will become more fully understood from the detailed description given hereinbelow and the accompanying drawing which is given by way of illustration only, and thus is not limitative of the present disclosure and wherein.

DETAILED DESCRIPTION OF THE INVENTION

Embodiments

Figure 1:
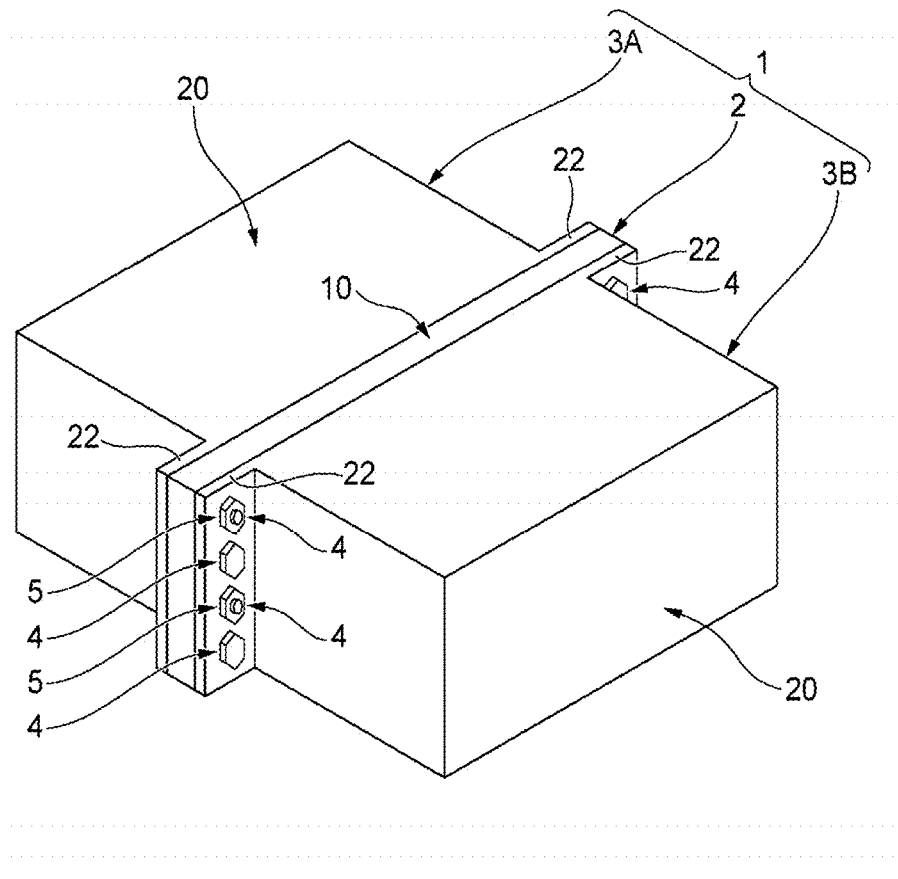
FIG. 1 is a perspective view showing an electric junction box according to an embodiment of the present disclosure.
Figure 1:
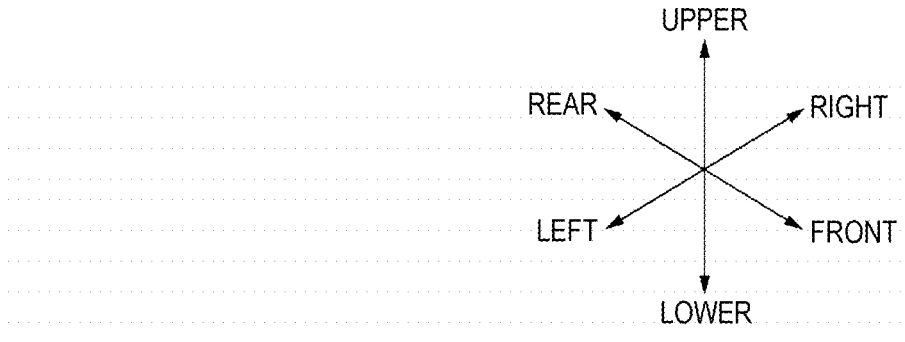

Hereinafter, an electric junction box 1 according to an embodiment of the present disclosure will be described with reference to the drawings. The electric junction box 1 is typically mounted on a vehicle and is used. For example, a junction box, a relay box, and the like can be used as the electric junction box 1, but the electric junction box 1 is not limited thereto. As shown in FIG. 1 and the like, the electric junction box 1 includes a cooling member 2 and a pair of conductive members 3A and 3B disposed to sandwich the cooling member 2. The cooling member 2 and the pair of conductive members 3A and 3B are fixed to each other by fastening using bolts 4 and nuts 5.

Hereinafter, for convenience of description, as shown in FIGS. 1 to 4, a "front-rear direction", a "left-right direction", and an "upper-lower direction" are defined. The "front-rear direction", the "left-right direction", and the "upper-lower direction" are orthogonal to one another. The "upper-lower direction" matches an upper-lower direction (a vertical direction) of the vehicle when the electric junction box 1 is mounted on the vehicle. The "front-rear direction" and the "left-right direction" are merely defined for convenience of description, and do not necessarily match a front-rear direction and a left-right direction of the vehicle when the electric junction box 1 is mounted on the vehicle. Hereinafter, the components constituting the electric junction box 1 will be described in order.

Figure 2:
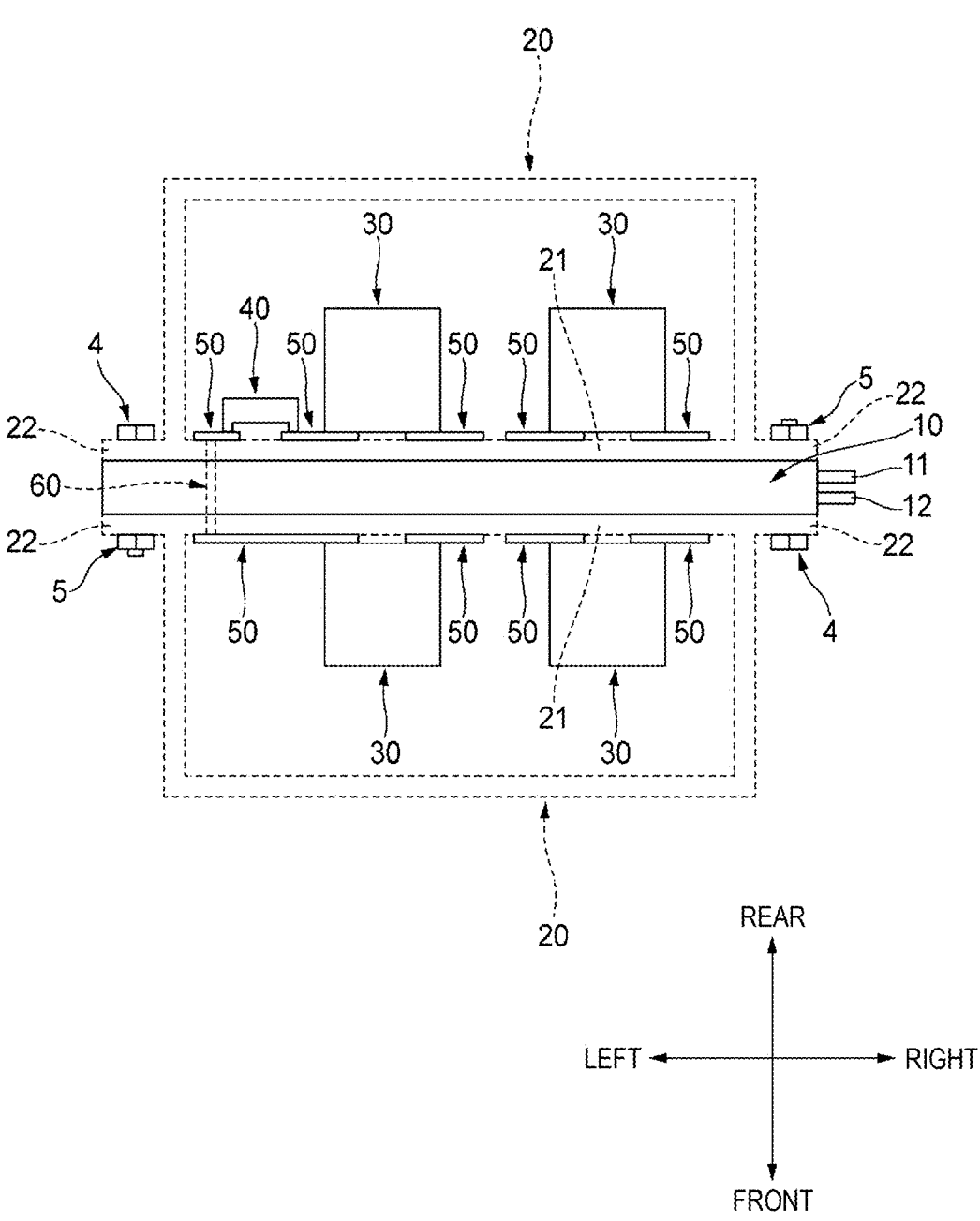
FIG. 2 is a top view of the electric junction box shown in FIG. 1 as seen through housing portions of conductive members.

First, the cooling member 2 will be described. As shown in FIGS. 1 and 2, the cooling member 2 has a rectangular main body portion 10 extending in the left-right direction and the upper-lower direction and being thin in the front-rear direction. The main body portion 10 is made of, for example, a metal or a resin. An inlet passage 11 and an outlet passage 12 communicating with the inside of the main body portion 10 are provided on a right side wall of the main body portion 10, and the inlet passage 11 and the outlet passage 12 are connected to a radiator (not shown) located outside the cooling member 2. A cooling water cooled by the radiator is introduced into the main body portion 10 through the inlet passage 11 by a pump (not shown) or the like, and absorbs heat from the outside through outer walls of the main body portion 10. The cooling water that has absorbed (been heated) heat is returned from the inside of the main body portion 10 to the radiator through the outlet passage 12, and is cooled again. By repeating such a cycle, the cooling member 2 functions to absorb heat from outer surfaces of the main body portion 10 and dissipate heat to the outside.

Next, the pair of conductive members 3A and 3B will be described. As shown in FIGS. 1 and 2, the pair of conductive members 3A and 3B have the same outer shape, and have the same structure except for the presence or absence of a fuse 40 to be described later and the arrangement of busbars 50 (see FIG. 2). The pair of conductive members 3A and 3B are disposed to sandwich the cooling member 2 in the front-rear direction in a state in which orientations in the front-rear direction are opposite to each other (a state in which each two corresponding flange portions 22 to be described later face each other in the front-rear direction). The weight of the pair of conductive members 3A and 3B is preferably substantially the same so that there is no excessive difference in weight between the front side and the rear side of the cooling member 2 when the pair of conductive members 3A and 3B are assembled to the cooling member 2. Hereafter, first, the conductive member 3A of the pair of conductive members 3A and 3B will be described.

Figure 3:
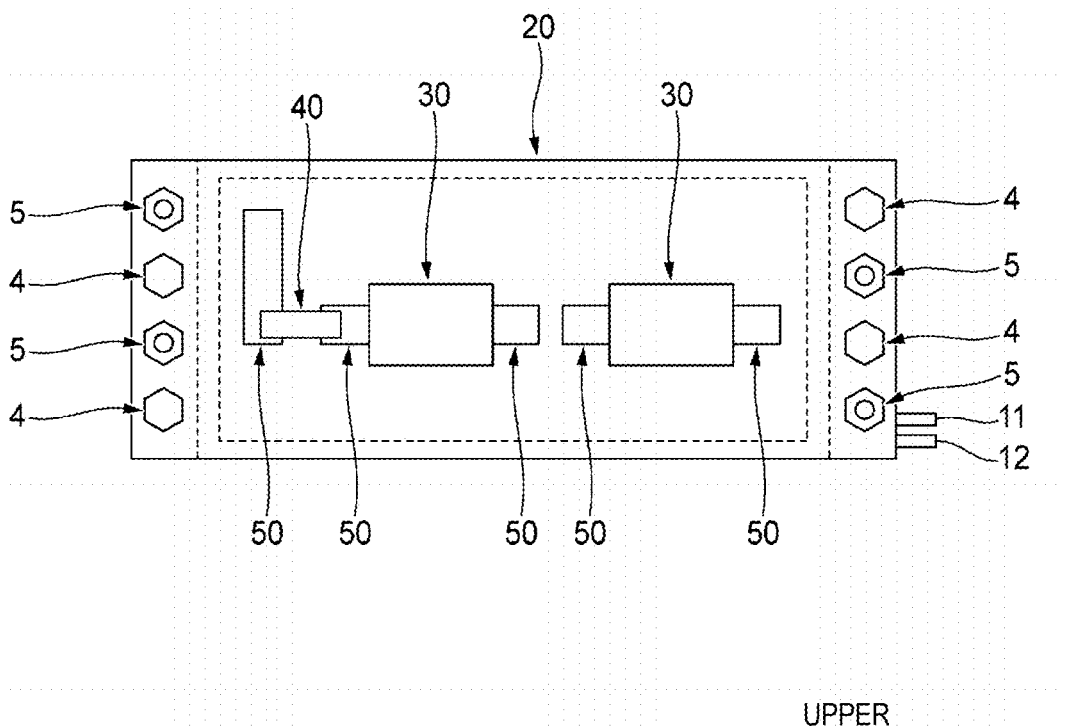
FIG. 3 is a front view of the electric junction box shown in FIG. 1 as seen through the housing portion of the conductive member.
Figure 3:
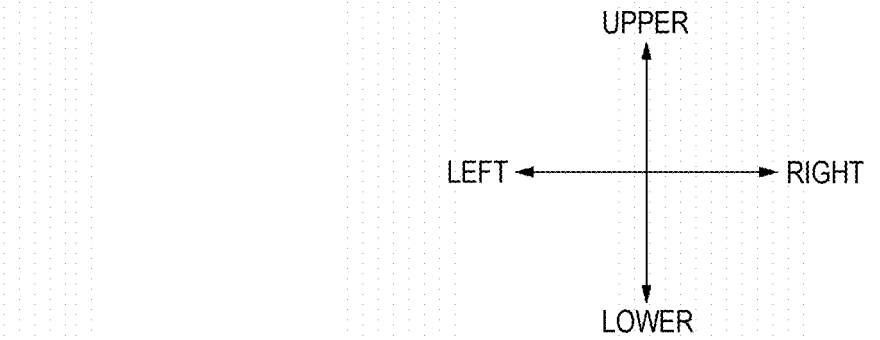

As shown in FIGS. 1 to 3, the electric conductive member 3A includes a housing portion 20 having a box shape, a plurality of relays 30 and a fuse 40 disposed inside the housing portion 20, and a plurality of busbars 50 that are provided on a mounting wall 21 as one box wall of the housing portion 20 and are electrically connected to the plurality of relays 30 and the fuse 40.

The housing portion 20 has a rectangular box shape extending in the left-right direction and the upper-lower direction and being thick in the front-rear direction. For example, the housing portion 20 is made of a resin. A front side wall (a rectangular flat plate-shaped wall extending in the left-right direction and the upper-lower direction that is disposed to face a rear side wall of the cooling member 2) of the housing portion 20 functions as the mounting wall 21 provided with the busbars 50 (see FIGS. 2 and 4). A plurality of through holes 23 penetrating from the inside to the outside of the mounting wall 21 are formed in portions of the mounting wall 21 in which the busbars 50 are provided (see FIG. 4). An operation achieved by providing such through holes 23 will be described later. A pair of left and right flange portions 22 are provided on the housing portion 20 to extend continuously outward from the mounting wall 21 in the left-right direction. A plurality of through holes (not shown) through which the bolts 4 are inserted are provided in each flange portion 22 to be aligned in the upper-lower direction. The flange portion 22 is a portion used for the above-described fastening using the bolts 4 and the nuts 5.

As shown in FIG. 2, two relays 30 and one fuse 40 are disposed inside the housing portion 20 to be aligned in the left-right direction along an inner surface of the mounting wall 21 in the vicinity of the inner surface of the mounting wall 21. The relay 30 is a component that performs a switching function of turning ON and OFF the energization, and the fuse 40 is a component that performs a fuse function of turning OFF the energization when a current exceeding a rated current flows. The plurality of flat plate-shaped busbars 50 are provided on the mounting wall 21 to face the inner surface of the mounting wall 21 and to be aligned in the left-right direction along the inner surface. Specifically, the plurality of busbars 50 are disposed such that a pair of right and left busbars 50 corresponding to each of the relays 30 and the fuse 40 are electrically connected.

Hereinafter, an internal structure of the relay 30 and a connection structure between the relay 30 and the pair of busbars 50 will be briefly described with reference to FIG. 4. The relay 30 includes a pair of metal terminals 31 provided to protrude to the outside from one side wall (a front side wall) of a housing of the relay 30, a metal movable contact point 32 provided inside the housing of the relay 30 and capable of mechanically switching a conductive state and a non-conductive state between the plurality of terminals 31, a coil 33 provided inside the housing of the relay 30 and driving the movable contact point 32, and a contact spring 35 provided inside the housing of the relay 30 and disposed between a core 34 of the coil 33 and the movable contact point 32. The contact spring 35 constantly biases the movable contact point 32 to a conduction side (the front side). When the coil 33 is energized, the coil 33 exerts an attractive force for driving the movable contact point 32 to a non-conduction side (the rear side) against a biasing force of the contact spring 35. As described above, the relay 30 can mechanically switch the conductive state and the non-conductive state between the plurality of terminals 31 by switching non-energization and energization to the coil 33.

In the relay 30, the movable contact point 32 is located at a position (a position on the rear side) farther away from one side wall (the front side wall) of the housing of the relay 30 than the plurality of terminals 31, and the plurality of terminals 31 and the movable contact point 32 are located to be aligned in the front-rear direction. Therefore, for example, even in a case in which a component (for example, the coil 33) around the movable contact point 32 falls off due to aged deterioration, an excessive external force, or the like, the component falls downward in the vertical direction, and thus it is possible to avoid the component from interfering with the switching between the conductive state and the non-conductive state between the movable contact point 32 and the plurality of terminals 31.

Each of the plurality of terminals 31 of the relay 30 is fastened and fixed to the corresponding busbar 50 by a metal bolt 51 in a recess of corresponding one of the pair of corresponding busbars 50. Accordingly, the pair of busbars 50 and the relay 30 are fixed to each other, and the pair of busbars 50 are electrically connected to the relay 30. The conductive member 3A of the pair of conductive members 3A and 3B has been described above.

Next, the conductive member 3B of the pair of conductive members 3A and 3B will be described. The conductive member 3B has the same outer shape as the conductive member 3A. The conductive member 3B has the same structure as that of the conductive member 3A except that the fuse 40 is not provided and the arrangement of the busbars 50 is different accordingly (see FIG. 2). Therefore, the descriptions of other detailed structures of the conductive member 3B will be omitted. The components constituting the electric junction box 1 have been described above.

Next, the assembly of the electric junction box 1 will be described. In order to assemble the electric junction box 1, as shown in FIG. 1, the conductive members 3A and 3B are respectively disposed on the rear side and the front side of the cooling member 2 so that the pair of conductive members 3A and 3B sandwich the cooling member 2 in the front-rear direction. Next, a gap (see FIG. 4) between an outer surface of the mounting wall 21 of the conductive member 3A and the outer surface of the main body portion 10 of the cooling member 2, which face each other, and a gap between an outer surface of the mounting wall 21 of the conductive member 3B and the outer surface of the main body portion 10 of the cooling member 2, which face each other, are filled with a paste-type heat transfer paste 70 having an excellent heat transfer property. Next, the cooling member 2 and the pair of conductive members 3A and 3B are fastened and fixed by using the plurality of nuts 5 and the plurality of bolts 4 collectively inserted into the through holes (not shown) provided in the flange portions 22 of the pair of conductive members 3A and 3B and the main body portion 10 of the cooling member 2. Next, one busbar 50 provided on the mounting wall 21 of the conductive member 3A and one busbar 50 provided on the mounting wall 21 of the conductive member 3B are electrically connected to each other by a connection busbar 60 provided outside the housing portions 20 of the conductive members 3A and 3B (see FIG. 2). Accordingly, the assembly of the electric junction box 1 is completed, and the electric junction box 1 shown in FIG. 1 is obtained. The busbars 50 may be connected to each other by using an electric wire instead of the connection busbar 60.

Here, in this example, as shown in FIG. 1 and the like, on both the left and right sides of the electric junction box 1, locations in which the bolts 4 are inserted from the front side and are fastened to the nuts 5 on the rear side and locations in which the bolts 4 are inserted from the rear side and are fastened to the nuts 5 on the front side are alternately disposed in the upper-lower direction. Accordingly, as compared with a mode in which the bolts 4 are inserted from one side in the front-rear direction and are fastened to the nuts 5 on the other side in the front-rear direction at all fastening positions on both the left and right sides of the electric junction box 1, external forces that are applied to the pair of conductive members 3A and 3B by the fastening and come close to each other are more likely to be evenly dispersed, and thus the inclination (lifting) or the like of the pair of conductive members 3A and 3B with respect to the cooling member 2 is less likely to be generated.

Figure 4:
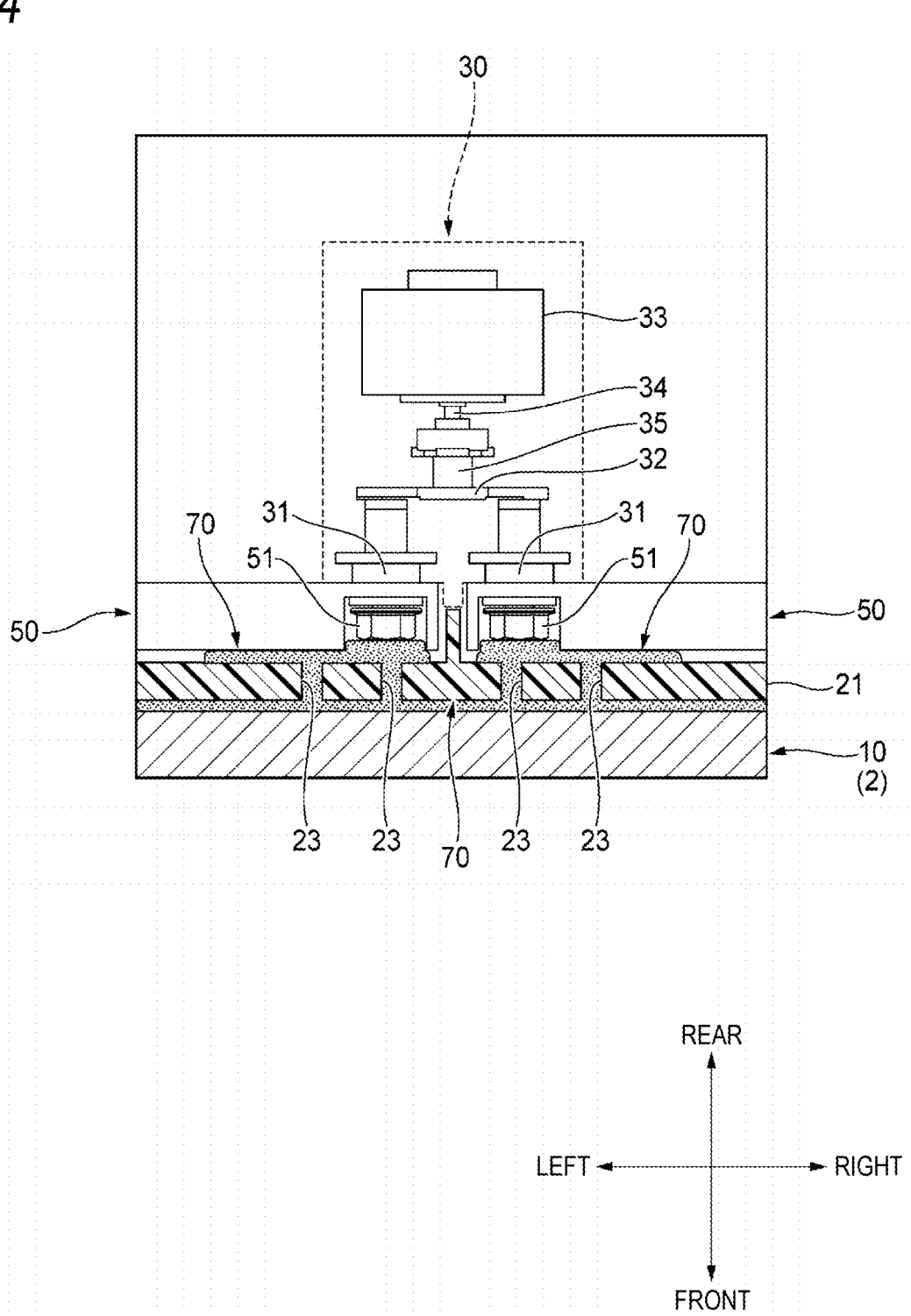
FIG. 4 is a cross-sectional view of the electric junction box shown in FIG. 1 taken along a horizontal plane in the vicinity of a relay disposed inside the housing portion of the conductive member, as seen through the inside of the relay.

In an assembly completion state of the electric junction box 1, as shown in FIGS. 2 and 4, the pair of conductive members 3A and 3B are disposed such that the outer surfaces of the mounting walls 21 of the conductive members 3A and 3B provided with the busbars 50 face the outer surfaces of the cooling member 2 and sandwich the cooling member 2. Accordingly, when the pair of conductive members 3A and 3B are energized, Joule heat generated in internal circuits (particularly, the movable contact points 32 and the coils 33) of the relays 30, contact points between the relays 30 and the fuse 40 and the busbars 50, and the busbars 50 is easily absorbed by the cooling member 2 via the mounting walls 21 and the heat transfer paste 70. Further, the pair of conductive members 3A and 3B are disposed to sandwich the cooling member 2, and thus a heat absorption capability of the cooling member 2 can be used without waste as compared with a case in which only one outer surface of the cooling member 2 is used for heat absorption.

Further, in the assembly completion state of the electric junction box 1, as shown in FIG. 4, for each of the conductive members 3A and 3B, a part of the heat transfer paste 70 disposed in the gap between the outer surface of the mounting wall 21 and the outer surface of the main body portion 10 of the cooling member 2, which face each other, passes through the plurality of through holes 23 provided in the mounting wall 21, spreads to an inner surface side of the mounting wall 21, and is in contact with the busbars 50 facing the inner surface of the mounting wall 21 (see FIG. 4). In other words, the heat transfer paste 70 is in contact with both the cooling member 2 and the busbars 50 via the through holes 23. Accordingly, the Joule heat generated in the contact points between the relays 30 and the fuse 40 and the busbars 50, and the busbars 50 can be efficiently transferred to the cooling member 2 via the heat transfer paste 70.

Further, in the assembly completion state of the electric junction box 1, the plurality of bolts 4 and the plurality of nuts 5 fix the pair of conductive members 3A and 3B while applying an external force to cause the pair of conductive members 3A and 3B to come close to each other. Accordingly, it is possible to maintain a state in which the mounting wall 21 of the housing portion 20 of each of the conductive members 3A and 3B is disposed close to the outer surface of the cooling member 2. Further, since the relatively heavy cooling member 2 is disposed between the pair of conductive members 3A and 3B, the center of gravity of the electric junction box 1 is positioned at the center of the electric junction box 1. As a result, the stability of the entire electric junction box 1 is improved.

Operations and Effects

As described above, according to the electric junction box 1 of the present embodiment, the pair of conductive members 3A and 3B including the relays 30, the fuse 40, and the busbars 50 are disposed such that the outer surfaces of the mounting walls 21 of the conductive members 3A and 3B provided with the busbars 50 face the outer surfaces of the cooling member 2 and sandwich the cooling member 2. Accordingly, the Joule heat generated in the internal circuits (particularly, the movable contact points 32 and the coils 33) of the relays 30, the contact points between the relays 30 and the fuse 40 and the busbars 50, and the busbars 50 during the energization is easily absorbed by the cooling member 2. Further, the pair of conductive members 3A and 3B are disposed to sandwich the cooling member 2, and thus the heat absorption capability of the cooling member 2 can be used without waste as compared with the case in which only one outer surface of the cooling member 2 is used for heat absorption. Therefore, the electric junction box 1 according to the present embodiment has excellent heat dissipation.

Further, the size of the cooling member 2 can be reduced as compared with a case in which the pair of conductive members 3A and 3B are disposed side by side on one outer surface of the cooling member 2, and thus it is possible to achieve miniaturization and cost reduction of the electric junction box 1.

Further, the electric junction box 1 is used in a posture in which the outer surfaces of the cooling member 2 performing the heat absorption and the mounting walls 21 of the conductive members 3A and 3B extend in the vertical direction. Accordingly, in the relay 30 connected to the busbars 50, the terminals 31 and the movable contact point 32 are located to be aligned in a direction (the front-rear direction) intersecting the vertical direction. Therefore, for example, even in the case in which a component (for example, the coil 33) around the movable contact point 32 falls off due to aged deterioration, an excessive external force, or the like, the component falls downward in the vertical direction, and thus it is possible to avoid the component from interfering with the switching between the conductive state and the non-conductive state between the movable contact point 32 and the terminals 31.

Further, the heat transfer paste 70 disposed to pass through the through holes 23 of the housing portions 20 of the conductive members 3A and 3B is in contact with both the cooling member 2 and the busbars 50. Accordingly, the Joule heat generated in the contact points between the relays 30 and the fuse 40 and the busbars 50, and the busbars 50 can be efficiently transferred to the cooling member 2 via the heat transfer paste 70. Therefore, the electric junction box 1 according to the present embodiment has further excellent heat dissipation.

Further, the plurality of bolts 4 and the plurality of nuts 5 fix the pair of conductive members 3A and 3B while applying the external force to cause the pair of conductive members 3A and 3B to come close to each other. Accordingly, it is possible to maintain the state in which the mounting wall 21 of the housing portion 20 of each of the conductive members 3A and 3B is disposed close to the outer surface of the cooling member 2, and thus it is possible to maintain the excellent heat dissipation over a long period of time.

Other Embodiments

The present disclosure is not limited to the embodiment described above, and various modifications can be adopted within the scope of the present disclosure. For example, the present disclosure is not limited to the embodiment described above, and modifications, improvements, and the like can be made appropriately. In addition, materials, shapes, sizes, numbers, arrangement positions, and the like of components in the above-described embodiment are freely selected and are not limited as long as the present disclosure can be implemented.

Here, the features of the above-described embodiment of the electric junction box 1 will be briefly summarized and listed in the following [1] to [3].

[1] An electric junction box (1) includes:

a cooling member (2) capable of absorbing heat from outer surfaces and dissipating heat to the outside; and a pair of conductive members (3A, 3B) disposed to sandwich the cooling member (2), in which each of the pair of conductive members (3A, 3B) includes a housing portion (20) having a box shape, an electronic component (30, 40) disposed inside the housing portion (20), and a busbar (50) that is provided on a mounting wall (21) as one box wall of the housing portion (20) and is electrically connected to the electronic component (30, 40), and each of the pair of conductive members (3A, 3B) is disposed such that an outer surface of the mounting wall (21) faces the outer surface of the cooling member (2), and the electronic component (30) includes a plurality of terminals (31) that are provided on a side wall of the electronic component (30) and are connected to the busbar (50), and a movable contact point (32) that is provided inside the electronic component (30) and is capable of mechanically switching a conductive state and a non-conductive state between predetermined terminals (31) among the plurality of terminals (31), and the electronic component (30) is configured in such a manner that the movable contact point (32) is located at a position farther away from the side wall than the plurality of terminals (31) in the electronic component (30).

According to the electric junction box having the configuration of the above [1], the pair of conductive members each incorporating the electronic component and the busbar are disposed such that the outer surfaces of the mounting walls of these conductive members face the outer surfaces of the cooling member and sandwich the cooling member. Accordingly, the Joule heat, which is generated in the internal circuit of the electronic component, the contact point between the electronic component and the busbar, and the busbar during the energization, is easily absorbed by the cooling member through the mounting walls. Further, since the pair of conductive members are disposed to sandwich the cooling member, the heat absorption capability of the cooling member can be used without waste as compared with the case in which only one outer surface of the cooling member is used for heat absorption, and thus the electric junction box having the present configuration has excellent heat dissipation.

Further, the size of the cooling member can be reduced as compared with a case in which the pair of conductive members are simply disposed side by side on one outer surface of the cooling member, and thus it is possible to achieve miniaturization and cost reduction of the electric junction box. In addition, when the electric junction box is used in the posture in which the outer surfaces of the cooling member and the mounting walls of the conductive members extend in the vertical direction (the upper-lower direction), the terminals and the movable contact point are disposed to be aligned in the direction (for example, a lateral direction) intersecting the vertical direction in the electronic component connected to the busbar. Therefore, for example, even in the case in which a component around the movable contact point falls off due to aged deterioration, an excessive external force, or the like, the component falls downward in the vertical direction, and thus it is possible to avoid the component from interfering with the switching of the conductive state and the non-conductive state between the movable contact point and the terminals.

[2] The electric junction box (1) according to the above [1] further includes:

a heat transfer member (70) configured to transfer heat between the cooling member (2) and each of the pair of conductive members (3A, 3B), in which the housing portion (20) of each of the pair of conductive members (3A, 3B) has a through hole (23) penetrating from the inside to the outside of the mounting wall (21), and the heat transfer member (70) is disposed to pass through the through holes (23) and be in contact with both the cooling member (2) and the busbars (50) provided on the mounting walls (21).

According to the electric junction box having the configuration of the above [2], the heat transfer member disposed to pass through the through holes of the housing portions of the conductive members is in contact with both the cooling member and the busbars. Accordingly, the Joule heat generated in the internal circuit of the electronic component, the contact point between the electronic component and the busbar, and the busbars can be efficiently transferred to the cooling member via the heat transfer member. Therefore, the electric junction box having the present configuration has further excellent heat dissipation.

[3] The electric junction box (1) according to the above [1] further includes:

a fastening member (4, 5) that fixes the pair of conductive members (3A, 3B) while applying an external force to cause the pair of conductive members (3A, 3B) to come close to each other.

According to the electric junction box having the configuration of the above [3], the fastening member fixes the pair of conductive members while applying the external force to cause the pair of conductive members to come close to each other. Accordingly, it is possible to maintain the state in which the mounting wall of the housing portion of each conductive member is disposed close to the outer surface of the cooling member, and thus it is possible to maintain the excellent heat dissipation over a long period of time.

The invention claimed is:

1. An electric junction box comprising:

a cooling member capable of absorbing heat from outer surfaces and dissipating heat to the outside; and a pair of conductive members disposed to sandwich the cooling member, wherein:

each of the pair of conductive members includes a housing portion having a box shape, an electronic component disposed inside the housing portion, and a busbar that is provided on a mounting wall as one box wall of the housing portion and is electrically connected to the electronic component, and each of the pair of conductive members is disposed such that an outer surface of the mounting wall faces the outer surface of the cooling member; and the electronic component includes a plurality of terminals that are provided on a side wall of the electronic component and are connected to the busbar, and a movable contact point that is provided inside the electronic component and is capable of mechanically switching a conductive state and a non-conductive state between predetermined terminals among the plurality of terminals, and the electronic component is configured in such a manner that the movable contact point is located at a position farther away from the side wall than the plurality of terminals in the electronic component.

2. The electric junction box according to claim 1, further comprising:

a heat transfer member configured to transfer heat between the cooling member and each of the pair of conductive members, wherein:

the housing portion of each of the pair of conductive members has a through hole penetrating from the inside to the outside of the mounting wall; and the heat transfer member is disposed to pass through the through holes and be in contact with both the cooling member and the busbars provided on the mounting walls.

3. The electric junction box according to claim 1, further comprising:

a fastening member that fixes the pair of conductive members while applying an external force to cause the pair of conductive members to come close to each other.

* * * * *